(12) United States Patent
D'Anna et al.

(10) Patent No.: US 6,831,332 B2
(45) Date of Patent: *Dec. 14, 2004

(54) MICROWAVE FIELD EFFECT TRANSISTOR STRUCTURE

(75) Inventors: Pablo D'Anna, Redding, CA (US); Joseph H. Johnson, Phoenix, AZ (US)

(73) Assignee: Sirenza Microdevices, Inc., Broomfield, CO (US)

(*) Notice: Subject to any disclaimer, the term of this patent is extended or adjusted under 35 U.S.C. 154(b) by 111 days.

This patent is subject to a terminal disclaimer.

(21) Appl. No.: 10/156,605

(22) Filed: May 25, 2002

(65) Prior Publication Data

US 2003/0218209 A1 Nov. 27, 2003

(51) Int. Cl.[7] .......................... H01L 29/76; H01L 29/94; H01L 31/062; H01L 31/113; H01L 23/58
(52) U.S. Cl. ..................... 257/343; 257/344; 257/408; 257/409; 257/488
(58) Field of Search ................................ 257/343, 344, 257/408, 409, 488, 335, 288

(56) References Cited

U.S. PATENT DOCUMENTS

| | | | |
|---|---|---|---|
| 5,055,896 A | 10/1991 | Williams et al. | |
| 5,252,848 A | 10/1993 | Adler et al. | |
| 5,841,166 A | 11/1998 | D'Anna et al. | |
| 5,907,173 A | 5/1999 | Kwon et al. | |
| 5,949,104 A | 9/1999 | D'Anna et al. | |
| 6,215,152 B1 | 4/2001 | Hebert | |
| 6,521,923 B1 * | 2/2003 | D'Anna et al. | ............. 257/288 |

* cited by examiner

Primary Examiner—Steven Loke
(74) Attorney, Agent, or Firm—Boris G. Tankhilevich (57) ABSTRACT

A microwave transistor structure comprising: (1) a substrate having a top surface; (2) a silicon semiconductor material of a first conductivity type; (3) a conductive gate; (4) a channel region of a second conductivity type; (5) a drain region of the second conductivity type; (6) a body of the first conductivity type; (7) a source region of the second conductivity type; (8) a shield plate region formed on the top surface of the silicon semiconductor material over a portion of the channel region, wherein the shield plate is adjacent and parallel to the drain region, and to the conductive gate region; and (9) a conductive plug region formed in the body region of the silicon semiconductor material, wherein the conductive plug region connects a lateral surface of the body region to the top surface of the substrate.

51 Claims, 4 Drawing Sheets

Channel Region of the Present Invention

MICROWAVE FIELD EFFECT TRANSISTOR STRUCTURE

BACKGROUND OF THE INVENTION

1. Field of the Invention

The present invention is in the field of microwave field effect transistors, and more specifically, is in the field of a new Silicon power LDMOS structure optimized for operation above 3 GHz, for use in wireless communication applications.

2. Discussion of the Prior Art

In the prior art, power high frequency devices have been built using a variety of semiconductor technologies. For a long time the preferred vehicle for their realization has been the NPN bipolar junction transistor (BJT). Its primary advantage was the achievable high intrinsic transconductance (gm) that permitted the fabrication of high power devices utilizing small silicon areas.

As processing technology improved, in the early 1970's a number of MOSFET vertical structures began to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the mid 1990's, new RF MOS devices that utilize the standard lateral MOS structure with a connection to the backside of the chip such that the back side becomes electrical and thermal ground, have extended the operational advantage of the MOSFET over the BJT into the 3 GHZ region thus covering three commercial bands of great importance: the cellular, PCS/PCN, and 3G mobile telephone bands. The concept of using the back side of the chip as an electrical and thermal ground was disclosed in the U.S. Pat. No. 5,949,104, issued to XEMOD, Inc.

As the applications for wireless communications move up in the frequency spectrum, parasitic resistances, capacitances and inductances limit the performance of the multiple conductive plug structure for lateral RF MOS devices, as described in the '104 patent.

What is needed is a new microwave transistor structure that has an improved performance due to the reduced parasitic gate-to-drain $C_{gd}$ capacitance, without impacting, in a deleterious manner, the other inter-electrode capacitances, including the gate-to-source $C_{gs}$ capacitance.

SUMMARY OF THE INVENTION

To address the shortcomings of the available art, the present invention provides a new microwave transistor structure that advances the frequency capabilities of the structure by diminishing the gate-to-drain $C_{gd}$ capacitance, without impacting, in a deleterious manner, the other inter-electrode capacitances, including the gate-to-source $C_{gs}$ capacitance.

One aspect of the present invention is directed to a microwave transistor structure. In one embodiment of the present invention, the microwave transistor structure comprises: (a) a substrate having a top surface; (b) a silicon semiconductor material of a first conductivity type including a first dopant concentration; the silicon semiconductor material is overlaying the top surface of the semiconductor substrate and has a top surface; (c) a conductive gate overlying and insulated from the top surface of the silicon semiconductor material; (d) a channel region of the first conductivity type formed completely within the silicon semiconductor material including a channel dopant concentration; (e) a drain region of the second conductivity type formed in the silicon semiconductor material and contacting the channel region; (f) a body region of the first conductivity type and having a body region dopant concentration formed in the silicon semiconductor material under the conductive gate region, any remaining portion of the silicon semiconductor material underlying the gate is of the first conductivity type; (g) a source region of the second conductivity type and having a source region dopant concentration formed in the silicon semiconductor material within the body region; (h) a shield plate region being adjacent and being parallel to the drain region formed on the top surface of the silicon semiconductor material over a portion of the channel region; the shield region is adjacent and parallel to the conductive gate region; the shield plate extends above the top surface of the silicon semiconductor material to a shield plate height level, and is insulated from the top surface of the silicon semiconductor material; and (i) a conductive plug region formed in the body region of the silicon semiconductor material to connect a lateral surface of the body region to the top surface of the substrate.

In one embodiment of the present invention, the drain has a drain dopant concentration greater than the channel region dopant concentration. In one embodiment of the present invention, the body region dopant concentration is equal or greater than the first dopant concentration.

In one embodiment of the present invention, the channel region (d) further includes: (d1) a first enhanced drain drift region of the first conductivity type and having a first enhanced drain drift region dopant concentration; and (d2) a second enhanced drain drift region of the second conductivity type and having a second enhanced drain drift dopant concentration contacting the first drain drift region.

In one embodiment, the second enhanced drain drift dopant concentration is greater than the first enhanced drain drift region dopant concentration; and the drain region dopant concentration is greater than the second enhanced drain region dopant concentration.

In one embodiment, the microwave transistor structure of the present invention further includes a contact enhanced region of the first conductivity type located within the body region and having a contact enhanced region dopant concentration. In one embodiment, the contact enhanced region dopant concentration is greater than the body region dopant concentration.

In one embodiment, the conductive plug region further includes a conductive plug region formed in the contact enhanced region and the body region and connecting a top surface or a lateral surface of the contact enhanced region and a lateral surface of the body region to the top surface of the substrate. The conductive plug further comprises a metal plug, or a silicided plug. The silicided plug is selected from the group consisting of a tungsten silicided plug, a titanium silicided plug, a cobalt silicided plug, and a platinum silicided plug.

In one embodiment, the conductive gate further comprises a highly doped polysilicon gate. In another embodiment, the conductive gate further comprises a sandwich gate further comprising a highly doped polysilicon bottom layer and a top layer selected from the group consisting of a tungsten silicided, a titanium silicided, a cobalt silicided, and a platinum silicided.

In one embodiment, the shield plate region further includes a shield plate region connected to the source region. In an alternative embodiment of the present invention, the shield plate region further includes a shield plate region connected to a backside of the structure. The shield plate further comprises: a metal shield plate; or a polysilicon shield plate; or a polysilicon/silicided shield plate sandwich; or a polysilicon/metal shield plate sandwich.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

LDMOS structures used in devices built for wireless communications have been optimized in recent years to improve their current capabilities and reduce parasitic source resistances and inductances.

For instance, the '104 patent, is directed to a lateral MOS structure having a plug connecting, in one embodiment, the source region at the chip surface to its backside, or connecting, in another embodiment, a surface of the source region and a lateral surface of the body region of the semiconductor material to a highly conductive substrate of the lateral MOS structure. The conductive plug of '104 patent structure can comprise: a metal plug, or a silicided plug, selected from the group consisting of: a tungsten silicided plug, a titanium silicided plug, a cobalt silicided plug, or a platinum silicided plug. The '104 patent structure allows one to obtain an increase in the packing density of the RF MOS device active areas per unit chip area, a reduction in the output capacitance of the RF MOS device, and an improvement in usable BW of the RF MOS device employed in amplifier circuits.

The U.S. Pat. No. 5,841,166, issued to Spectrian Corporation, discloses an IGFET device (lateral DMOS transistor) with reduced cell dimensions which is suitable for RF and microwave applications. The '166 structure includes a semiconductor substrate having an epitaxial layer with a device formed in a surface of the epitaxial layer. A sinker contact is provided from the surface to the epitaxial layer to the substrate for use in grounding the source region to the grounded substrate. The sinker contact is aligned with the source region and spaced from the width of the channel region. The lateral diffusion used in forming the sinker contact does not adversely affect the pitch of the cell structure. The reduced pitch increases output power and reduces parasitic capacitance thus making the '166 structure useful in different RF/microwave applications, like as a low side switch, and/or as an RF/microwave power transistor.

Efforts also have been made to reduce parasitic gate-to-drain $C_{gd}$ and gate-to-source $C_{gs}$ capacitances. More specifically, in the U.S. Pat. No. 5,912,490, issued to Spectrian Corporation, the shield plate was buried under the gate (not shown) to minimize the gate-to-drain capacitance $C_{gd}$ in a lateral DMOS and vertical DMOS field effect transistor.

In the U.S. Pat. No. 6,215,152, issued to CREE, Inc., a MOSFET had a buried shield plate with the gate being formed on the periphery of the of the buried shield plate, and an additional shield metal plate coupled to dielectric material (not shown). The second shield plate did not overlap the gate. The additional shield plate further minimized the gate-to-drain capacitance $C_{gd}$ by shielding any capacitance between the drain and the gate.

Figure 1:
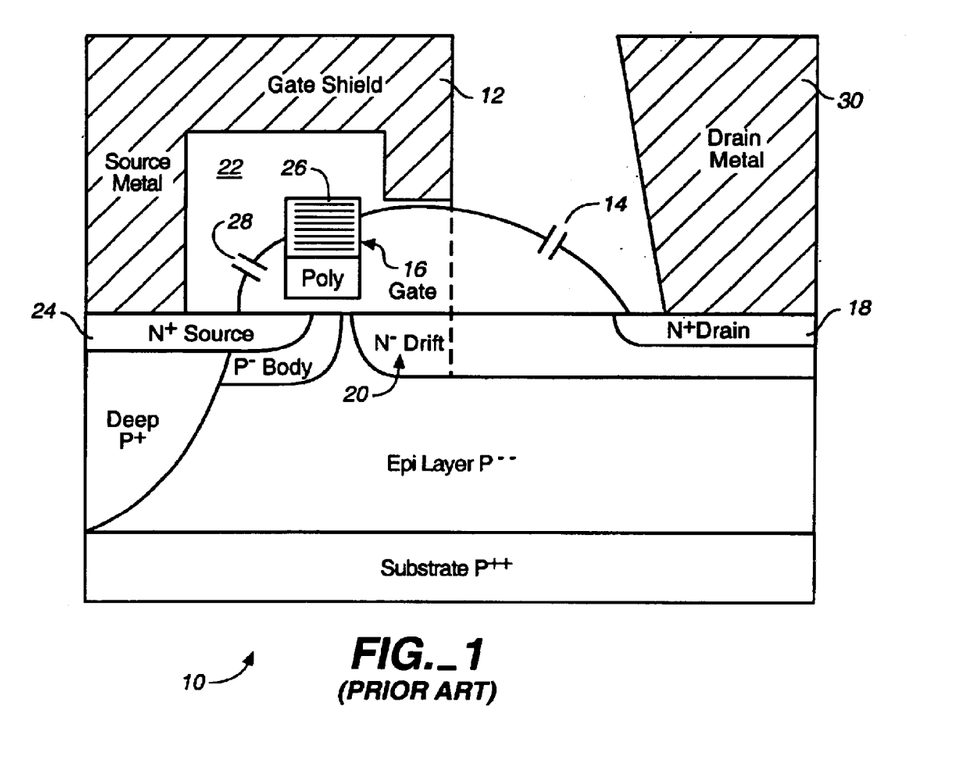
FIG. 1 depicts the prior art low on resistance FET structure disclosed by Adler et al. in the U.S. Pat. No. 5,252,848, issued to Motorola, Inc.

FIG. 1 depicts the prior art low on resistance FET structure 10 disclosed by Adler et al. in the U.S. Pat. No. 5,252,848, issued to Motorola, Inc. More specifically, a performance enhancing conductor—gate shield 12—is used to make a transistor built on structure 10 low on resistance. The gate shield 12 is also used reduce the transistor's 10 parasitic gate-to-drain capacitance $C_{gd}$ 14. The gate shield covers the transistor's 10 gate 16 and a portion of the drain region 20 that is adjacent the gate 16. The gate shield 12 is isolated from the gate 16 by an insulator 22. It has been found that gate shield 12 reduces the parasitic gate-to-drain capacitance $C_{gd}$ 14 of transistor 10. According to '848 patent, electric fields emanating from gate 16 capacitively couple gate 16 to drain 18 thus forming a parasitic gate-to-drain capacitance $C_{gd}$ 14. It is believed that gate shield 12 substantially terminates these electric field lines thereby minimizing the gate-to-drain capacitance $C_{gd}$ 14 of transistor 10. To maximize the termination effect of conductor 12, the gate shield 12 of '848 patent covered gate 16 completely. Since gate shield 12 of '848 patent structure minimizes the capacitive coupling between drain 18 and gate 16, drain 18 could be placed as close to source 24 as possible thus reducing the on resistance of transistor 10.

On the other hand, positioning conductor 12 near the upper surface 26 of gate 16 increased the gate-to-source capacitance $C_{gs}$ 28 of transistor structure 10 of '848 patent because the shield plate collects the electrical field lines that would have gone to the drain without the shield. The portion of conductor 12 overlying source 24 has substantially no affect on the gate-to-source capacitance $C_{gs}$ 28. The value of the gate-to-source capacitance $C_{gs}$ 28 gate could be minimized by increasing the distance between conductor 12 and the upper surface 26 of gate 16.

Figure 2:
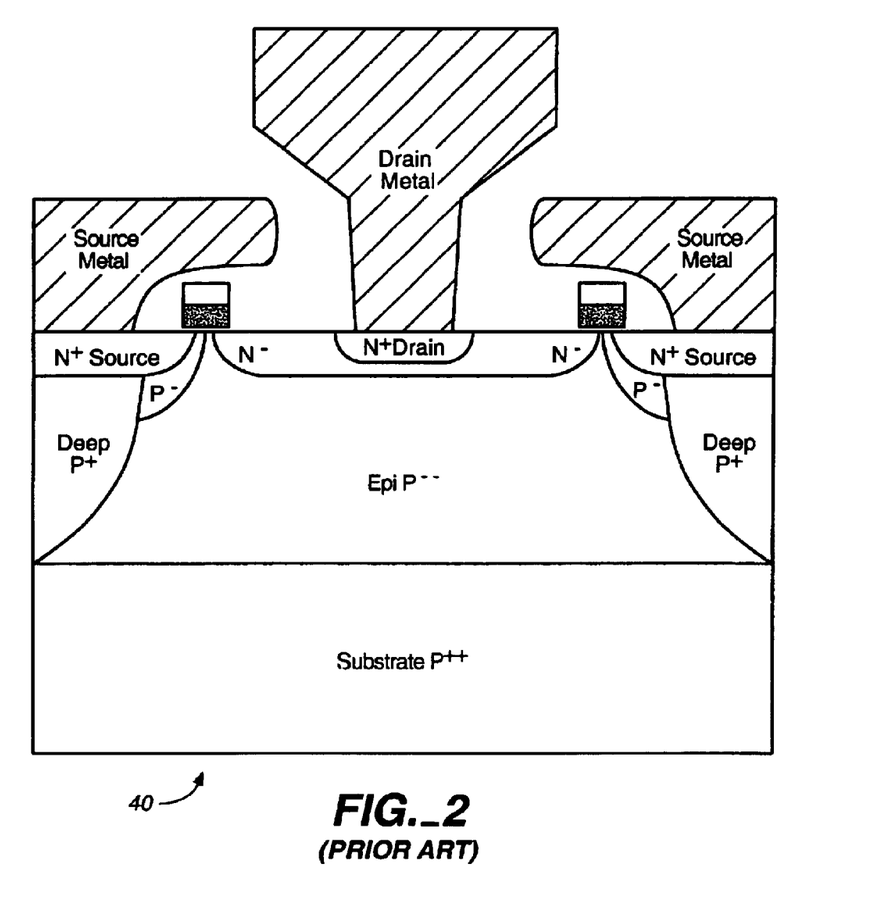
FIG. 2 illustrates the prior art aluminum-alloy top-metal structure that significantly improves median times to failure (MTTE) performance of the RF transistor as compared to conventional gold-based design.

FIG. 2 depicts a prior art aluminum-alloy top-metal structure 40 that significantly improves median times to failure (MTTE) performance of the RF transistor as compared to conventional gold-based designs, as was disclosed in the article "Aluminum-Base Metallization Enhances Device Reliability", published in Microwave a & RF, October 1998, page 61. The structure 40 of FIG. 2 has (MTTE) performance well in excess of 100 years at 200° C., as corroborated by measurements performed in conjunction with Sandia National Laboratory, Albuquerque, N.Mex.

Referring still to FIG. 1, as was stated above in the '848 patent, issued to Motorola, Inc., the classical solution to reducing the parasitic gate-to-drain capacitance $C_{gd}$ is to create a metal shield over the entire gate finger of the device, connected to the source metallization. While this method is effective, it involves the extension of the source metallization over the entire length of the gate finger. Such solution presents two problems. The first problem is as follows: the source metal extension, while lowering the gate-to-drain $C_{gd}$ capacitance, increases the gate-to-source $C_{gs}$ capacitance, as was stated above. In addition, if a device is realized with a single metal process there is a limitation to the coverage of the shield 12 over the gate 16 so as not to contact the drain metal finger 30, as shown in FIG. 1, to avoid shorting drain to source.

Another prior art dual metal structure 40, shown in FIG. 2, increases both the gate-to-source $C_{gs}$ and the gate-to-drain $C_{gd}$ capacitances.

The present invention advances the frequency capabilities of the structure by diminishing the gate-to-drain $C_{gd}$ capacitance, without impacting, in a deleterious manner, the other inter-electrode capacitances, including the gate-to-source $C_{gs}$ capacitance.

Figure 3:
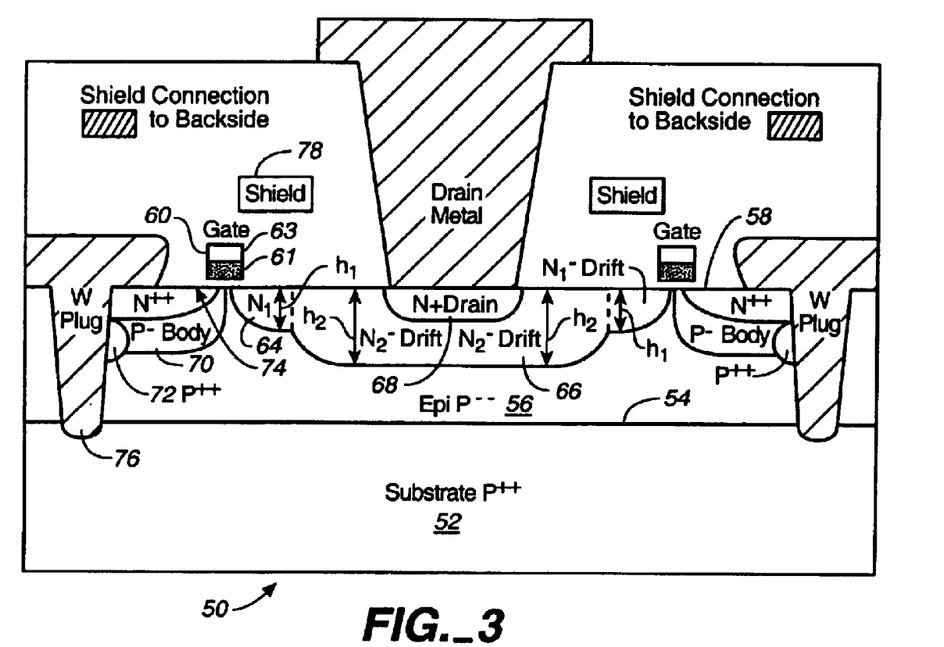
FIG. 3 shows a microwave transistor structure of the present invention.

In one embodiment of the present invention, FIG. 3 depicts a microwave transistor structure 50.

In one embodiment of the present invention, the structure 50 includes a substrate 52 having a top surface 54. In one embodiment, the substrate 52 further includes a silicon carbide (SiC) substrate. The usage of silicon carbide (SiC) substrate 52 significantly improves the thermoconductive properties of a microwave transistor built on structure 50 of FIG. 2, and is disclosed in the copending and filed on the same date U.S. Patent application entitled: "MICROWAVE FIELD EFFECT TRANSISTOR STRUCTURE ON SILICON CARBIDE SUBSTRATE", by the Inventors PABLO D'ANNA; and JOSEPH H. JOHNSON.

In one embodiment of the present invention, the substrate 52 further includes a silicon substrate. In one embodiment of the present invention, the substrate 52 is a highly conductive one and is P-doped with concentration of carriers (0.005–0.01) Ω-cm. In one embodiment, the silicon substrate 52 is heavily Boron doped ($P^{++}$).

Referring still to FIG. 3, in one embodiment of the present invention, the microwave semiconductor structure 50 further includes a silicon semiconductor material 56 of a first conductivity type having a first dopant concentration and a top surface 58. The silicon semiconductor material 56 is overlaying the top surface 54 of the semiconductor substrate 52. In one embodiment, the silicon semiconductor material 56 is epitaxially grown and comprises an epi layer.

In one embodiment, the first conductivity type is of P type, that is the majority carriers are holes. The epi layer's conductivity type is also P-type in this embodiment. In this embodiment, the dopant concentration of the substrate is $P^{++}$, wherein (++) indicates that the dopant concentration $P^{++}$ of holes in the substrate 52 is large comparatively with the hole concentration $P^{--}$ in the epi layer region 56. The typical thickness of the epitaxial layer 56 is $(3-10)\mu$.

In another embodiment of the present invention, the epi layer 56 includes a semiconductor material of a second—conductivity type having a dopant concentration $N^{--}$. The majority carriers are electrons in this embodiment.

In one embodiment, a thin epi silicon layer 56 on the top surface 54 of the substrate 52 can be grown by using a high temperature chemical vapor deposition (CVD) process. Chemical vapor deposition (CVD) process is the process in which a film is deposited by a chemical reaction or decomposition of a gas mixture at elevated temperature at the wafer surface or in its vicinity. The typical examples of CVD films are a single crystal silicon film, a polycrystalline silicon film, a silicon dioxide film, and a silicon-nitride film. CVD can be performed at atmospheric pressure (APCVD), or at low pressure (LPCVD).

As was mentioned above, epitaxy is a high temperature chemical vapor deposition (CVD) process where a single crystal layer is deposited on a single crystal substrate. Epitaxy is the arrangement of atoms on an ordered substrate which acts as the seed crystal. The atoms produced by the gas reaction impinge on the substrate surface and move around until they find the correct location to bond to the surface atoms, forming a layer of the same crystallographic arrangements as the substrate.

In one of the typical applications of epitaxial deposition, a lightly doped layer is deposited on a heavily doped substrate. The lightly doped layer is the region where active devices are constructed and the heavily doped substrate constitutes a low resistance circuit path.

In another typical application of epitaxial deposition, heavily doped layer is buried in a lightly doped region of opposite polarity. The heavily doped layer is first defined and formed in the substrate using lithography, etching, and doping techniques. For the complete reference, please, see "Fundamentals of Semiconductor Processing Technologies" by Badih El-Kareh, IBM Corporation, published by Kluwer Academic Publishers in 1995.

The epi layer can be intentionally doped while grown by adding controlled amounts of the dopant compounds to the gas stream. Typical dopant sources are hybrids of the impurity, such as phosphine ($PH_3$), arsine ($AsH_3$), antimonine ($SbH_3$), and diborane ($B_2H_6$).

In one embodiment, the epi silicon layer 56, about 3–12 microns thick, is grown on the top surface 54 of the substrate 52 in the presence of diborane ($B_2H_6$). This process results in a lightly Boron doped ($P^{--}$) epi silicon layer 56.

A conductive gate 60 overlies the top surface 58 of the epi layer 56. The conductive gate 60 is insulated from the epi layer 56 by a gate silicon dioxide layer (not shown). In one embodiment, a layer of silicon dioxide is grown by oxidizing the silicon surface 58 in a high temperature furnace.

In one embodiment, the gate 60 comprises a polysilicided gate. In another embodiment, the conductive gate 60 further comprises a highly doped polysilicon gate. In one more embodiment, the conductive gate 60 further comprises a sandwich gate further comprising a highly doped polysilicon bottom layer 61 and a top layer 63 selected from the group consisting of a tungsten silicided, a titanium silicided, a cobalt silicided, and a platinum silicided. In one additional embodiment, the conductive gate 60 further comprises a metal gate.

Although silicide generally has a lower resistance than polysilicon, silicide does not readily adhere to gate oxide. Thus, the polysilicon functions as an intermediate layer that bonds to both the silicide and to gate oxide. In the preferred embodiment, gate electrode 60 is approximately 1500 Å of polysilicon that is covered with approximately 2500 Å of tungsten silicide (WSi). The two layer implementation of gate 60 forms a low resistance gate that has a lower profile than is provided by a single layer polysilicon gate of equivalent resistance.

Referring still to FIG. 3, in one embodiment of the present invention, the microwave semiconductor structure 50 further includes a channel region formed completely within the epi layer 56. If the epi layer is of the first, P conductivity type, the channel region is of a second, N, conductivity type and includes a channel dopant concentration N−.

In one embodiment of the present invention, the channel region further includes a first enhanced drain drift region 64 of the second N conductivity type formed completely within the epi layer 56, and having the first enhanced drain drift region dopant concentration $N_1^-$ if the epitaxial layer has P conductivity type. In another embodiment, the first enhanced drain drift region 64 has P conductivity type if the epitaxial layer has N conductivity type. In one embodiment, the first enhanced drain region 64 has dimensions $(0.1–2.5)\mu$ laterally, and about $(0.2–0.5)\mu$ vertically.

In one embodiment of the present invention, the channel region further includes a second enhanced drain drift region 66 of the second N conductivity type formed completely within the epi layer 56 and having the second enhanced drain drift dopant concentration $N_2^-$ if the epitaxial layer has P conductivity type. In another embodiment, the second enhanced drain drift region 66 has P conductivity type if the epitaxial layer has N conductivity type. The second enhanced drain drift region 66 contacts the first drain drift region 64.

In one embodiment of the present invention, the second enhanced drain drift dopant concentration $N_2^-$ is greater than the first enhanced drain drift region dopant concentration $N_1^-$:

$$N_2^- > N_1^-. \tag{1}$$

Referring still to FIG. 3, the drain region 68 formed in the silicon semiconductor material. In one embodiment, the drain region 68 is of the second conductivity type N (if the epi layer has P conductivity type and vice versa) and includes a drain dopant concentration $N_{dfrain}^+$. The drain region 68 contacts the channel region. The typical dimensions of the drain region 68 are $(0.5–3.0)\mu$ horizontally, and $(0.1–0.3)\mu$ vertically.

In one embodiment, the drain region 68 includes a drain dopant concentration $N_{drain}^+$ that is greater than the second enhanced drain region dopant concentration $N_2^-$:

$$N_{drain}^+ > N_2^-. \tag{2}$$

Referring still to FIG. 3, in one embodiment of the present invention, the second enhanced drain drift region 66 is formed completely within the epi layer 56 to a second depth level $h_2$, whereas the first enhanced drain drift region 64 is formed completely within the epi layer 56 to a first depth level $h_1$. In one embodiment, the second depth level $h_2$ is greater than the first depth level $h_1$:

$$h_2 > h_1. \tag{3}$$

The structure of the microwave transistor 50 (of FIG. 3) of the present invention including two drain drift regions (64 and 66) allows one to increase the maximum drain drift current density of the device and the drain-to-source breakdown voltage $V_{breakdown}$ of the structure 50 (of FIG. 3) is also increased. Indeed, the effective electrical field in the channel region is strong enough (about 10 kV/cm) to cause at certain critical concentration of carriers $N_c$ the avalanche effect of carrier multiplication. Thus, the critical carrier concentration $N_c$ is related to the breakdown voltage $V_{breakdown}$, that is defined as the voltage at which the avalanche effect of carrier multiplication takes place.

According to (eq. 1), the second drain drift region 66 has the concentration $N_2^-$ that is higher than the concentration $N_1^-$ of the first drain drift region 64. This results in the redistribution of the critical electrical fields in the source-drain channel and in an increase of the drain-to-source breakdown voltage $V_{breakdown}$. The maximum current density in the source-drain channel of the device is also increased because the total concentration:

$$N_T = N_1^- + N_2^- \tag{4}$$

in both drain enhancement regions reduces the resistance of the drain region 68.

Figure 4:
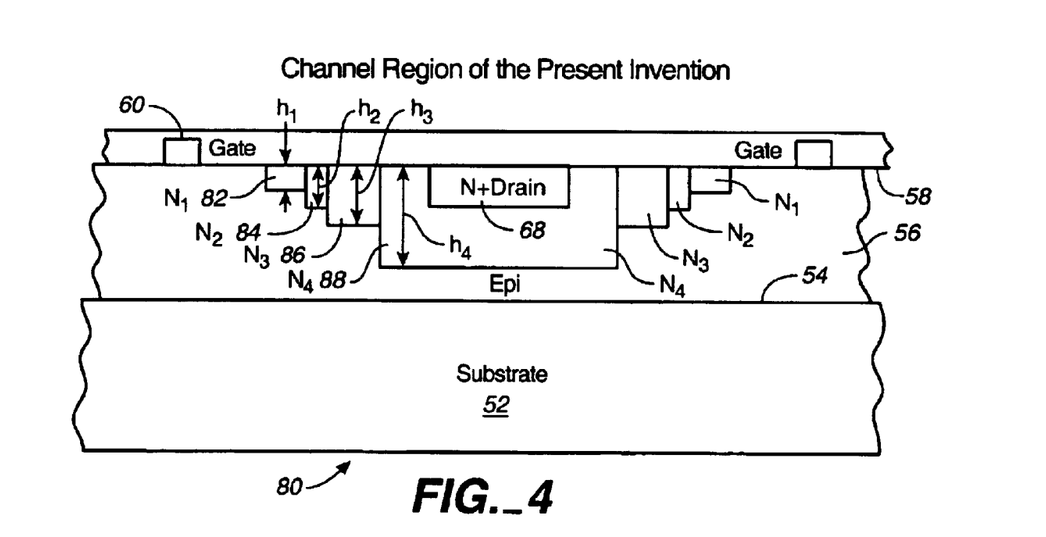
FIG. 4 depicts the channel region of FIG. 3 in more details.

FIG. 4 depicts the channel region 80 (64–66 of FIG. 3) in more details. In one embodiment of the present invention, channel region 80 further comprises a first enhanced drain drift region 82 formed completely within the semiconductor material 56 to a first depth level $h_1$, a second enhanced drain drift region 84 formed completely within the semiconductor material 56 to a second depth level $h_2$, and a third enhanced drain drift region 86 formed completely within the semiconductor material 56 to a third depth level $h_3$. In one embodiment, the first enhanced drain drift region 82 is of the second N conductivity type, and includes a first enhanced drain drift region dopant concentration $N_1^-$, the second enhanced drain drift region 84 is of the second N conductivity type, and includes a second enhanced drain drift region dopant concentration $N_2^-$, and the third enhanced drain drift region 86 is of the second N conductivity type, and includes a third enhanced drain drift region dopant concentration $N_3^-$.

In one embodiment of the present invention, depicted in FIG. 4, the drain region dopant concentration $N_{drain}^+$ is greater than the third enhanced drain drift region dopant concentration $N_3^-$, the third enhanced drain drift region dopant concentration $N_3^-$ is greater than the second enhanced drain drift region dopant concentration $N_2^-$, and the second enhanced drain drift region dopant concentration $N_2^-$ is greater than the first enhanced drain drift region dopant concentration $N_1^-$:

$$N_{dfrain}^+ > N_3^- > N_2^- > N_1^-. \tag{5}$$

In one embodiment of the present invention, as shown in FIG. 4, the third depth level $h_3$ is greater than the second depth level $h_2$, and the second depth level $h_2$ is greater than the first depth level $h_1$:

$$h_3 > h_2 > h_1. \tag{6}$$

"In one embodiment (not shown in the FIGS.), the third enhanced drain drift region 82 is extended into said semiconductor material 56 at the same depth level as the second enhanced drain drift region, and the second enhanced drain drift region is extended into said semiconductor material 56 at the same depth level as the first enhanced drain drift region."

In one embodiment of the present invention, as shown in FIG. 4, channel region 80 further comprises a first enhanced drain drift region 82 formed completely within the semiconductor material 56 to a first depth level $h_1$, a second enhanced drain drift region 84 formed completely within the semiconductor material 56 to a second depth level $h_2$, a third enhanced drain drift region 86 formed completely within the semiconductor material 56 to a third depth level $h_3$, and a fourth enhanced drain drift region 88 formed completely within the semiconductor material 56 to a fourth depth level $h_4$. In one embodiment, the first enhanced drain drift region 82 is of the second N conductivity type, and includes a first enhanced drain drift region dopant concentration $N_1^-$, the second enhanced drain drift region 84 is of the second N conductivity type, and includes a second enhanced drain drift region dopant concentration $N_2^-$, the third enhanced drain drift region 86 is of the second N conductivity type, and includes a third enhanced drain drift region dopant concentration $N_3^-$, and the fourth enhanced drain drift region 88 is of the second N conductivity type, and includes a fourth enhanced drain drift region dopant concentration $N_4^-$.

In one embodiment of the present invention, depicted in FIG. 4, the drain region dopant concentration $N_{drain}^+$ is greater than the fourth enhanced drain drift region dopant concentration $N_4^-$, the fourth enhanced drain drift region dopant concentration $N_4^-$ is greater than the third enhanced drain drift region dopant concentration $N_3^-$, the third enhanced drain drift region dopant concentration $N_3^-$ is greater than the second enhanced drain drift region dopant concentration $N_2^-$, and the second enhanced drain drift region dopant concentration $N_2^-$ is greater than the first enhanced drain drift region dopant concentration $N_1^-$:

$$N_{drain}^+ > N_4^- > N_3^- > N_2^- > N_1^-. \quad (7)$$

In one embodiment of the present invention, as shown in FIG. 4, the fourth depth level $h_4$ is greater than the third depth level $h_3$, the third depth level $h_3$ is greater than the second depth level $h_2$, and the second depth level $h_2$ is greater than the first depth level $h_1$:

$$h_4 > h_3 > h_2 > h_1. \quad (8)$$

In one embodiment (not shown in the Figures), the fourth enhanced drain drift region 88 is extended into said semiconductor material 56 at the same depth level as the third enhanced drain drift region 86, the third enhanced drain drift region 86 is extended into said semiconductor material 56 at the same depth level as the second enhanced drain drift region 84, and the second enhanced drain drift region 84 is extended into said semiconductor material 56 at the same depth level as the first enhanced drain drift region 82.

Referring still to FIG. 3, in one embodiment of the present invention, a body region 70 is also formed in the epi layer. The body region 70 includes a first end underlying the conductive gate 60, any remaining portion of the silicon semiconductor material underlying the gate 60 is of the first conductivity type.

The body region 70 has P conductivity type (if the epi layer has P conductivity type and vice versa). The body region has a dopant concentration $P^-$ that is equal or greater than the dopant concentration $P^{--}$ of the epi layer 56. The typical dimensions of the body region 70 are $(0.5–1.5)\mu$ horizontally or vertically.

In one embodiment, the body region 70 includes a source region 74 being of N conductivity type N (if the epitaxial layer has P conductivity type and vice versa) and having a dopant concentration $N^{++}$. The typical dimensions of the source region 74 are $(0.5–5.0)\mu$ horizontally.

Referring still to FIG. 3, the body region 70 also includes a contact enhanced region 72. In one embodiment, the contact enhanced region 72 is of the first conductivity type (if the epitaxial layer has P conductivity type and vice versa) and includes a contact enhanced region dopant concentration $P^{++}$ that is greater than the body region dopant concentration P. The typical dimensions of the contact enhanced region 72 are $(0.5–3.0)\mu$ vertically or horizontally.

Referring still to FIG. 3, in one embodiment, the conductive plug region 76 is formed in the contact enhanced region 72 and the body region 70 of the silicon semiconductor material. In this embodiment, the conductive plug region 76 connects a top surface or a lateral surface of the contact enhanced region 72 and connects a lateral surface of the body region 70 to the top surface 54 of the substrate 52.

In another embodiment (not shown), the conductive plug region 76 is formed in the body region 70 of the silicon semiconductor material. In this embodiment, the conductive plug region 70 connects a lateral surface of the body region 70 to the top surface 54 of the substrate 52.

The conductive plug region 76 includes a conductive plug. The conductive plug comprises a metal plug, or a silicided plug. In one embodiment, the silicided plug is selected from the group consisting of a tungsten silicided plug, a titanium silicided plug, a cobalt silicided plug, and a platinum silicided plug.

The usage of the conductive plug 76 in the microwave transistor structure 50 of FIG. 3 allows one to make a good ohmic contact in a small area of a microwave device without having long thermal cycles needed in case of diffusion dopant. Thus, the usage of a conductive plug prevents the increase in the doping movements and betters the usage of the small areas of the microwave device. The better usage of small areas allows a design engineer to increase the density of the microwave structures 50 (of FIG. 3) that can be placed per inch$^2$.

In one prior art structure, disclosed in U.S. Pat. No. 5,155,563 (issued to Motorola), a connection of the source and body regions in the MOS structure to the backside is made through the diffusion of a dopant introduced from the topside of the chip and a metal finger short. However, this diffusion not only moves the topside dopant down and sideways but also moves the substrate dopant up thus reducing the distance between the highly doped substrate interface and the drain area of the device. This diffusion movement of the interface produces an increase of the minimum source-drain capacitance $C_{ds}$ that can be obtained under a high voltage bias $V_{DS}$.

In another prior art structure disclosed in the U.S. Pat. No. 5,841,166 (issued to Spectrian), the connection between the source and body regions in the MOS structure to backside was made by a sinker contact aligned with the source region and spaced from the width of the channel region.

On the other hand, the usage of the conductive plug 76 in the microwave transistor structure 50 (of FIG. 3) of the present invention, takes care of two important prior art technological problems: (1) how to make a good ohmic contact in a small area (2) without long thermal processing cycles. As it is well known in the art, the long thermal processing cycles increase the doping movements thus increasing the source-drain capacitance $C_{ds}$.

Referring still to FIG. 3, the microwave structure 50 her includes a shield plate region 78 formed on the top surface 58 of the epi layer 56 over a portion of the channel region. In one embodiment, the shield plate 78 is adjacent and parallel to the drain region 68, and to the conductive gate region 60. In one embodiment, the shield plate 78 extends above the top surface 58 of the epi layer 56 to a shield plate height level. The shield plate 78 is insulated from the top surface 58 of the epi layer 56.

Gate 60 is electrically isolated from the shield plate 78 by an insulator. The preferred embodiment of the insulator is a low temperature thermal oxide that is covered by a layer of silicon nitride (not shown). Silicon nitride provides a highly reliable and substantially defect free insulator that prevents contaminants from affecting the operation of transistor 50. Oxide (not shown) functions as a stress relief that prevents silicon nitride from damaging gate oxide.

The shield plate 78 further comprises: (a) a metal shield plate; or (b) a polysilicon shield plate; or (c) a polysilicon/silicided shield plate sandwich; or (d) a polysilicon/metal shield plate sandwich.

In one embodiment, the shield extends above the top surface of the silicon semiconductor material 58 to the shield plate height, wherein the shield plate height level is in the range of (4,000 Å–8,000 Å).

In one embodiment, the microwave transistor structure 50 (of FIG. 3) includes the shield plate region 78 connected to the source region 74 (not shown). In another embodiment, the microwave transistor structure 50 (of FIG. 3) includes the shield plate region 78 connected to a backside of the structure (not shown).

Figure 5:
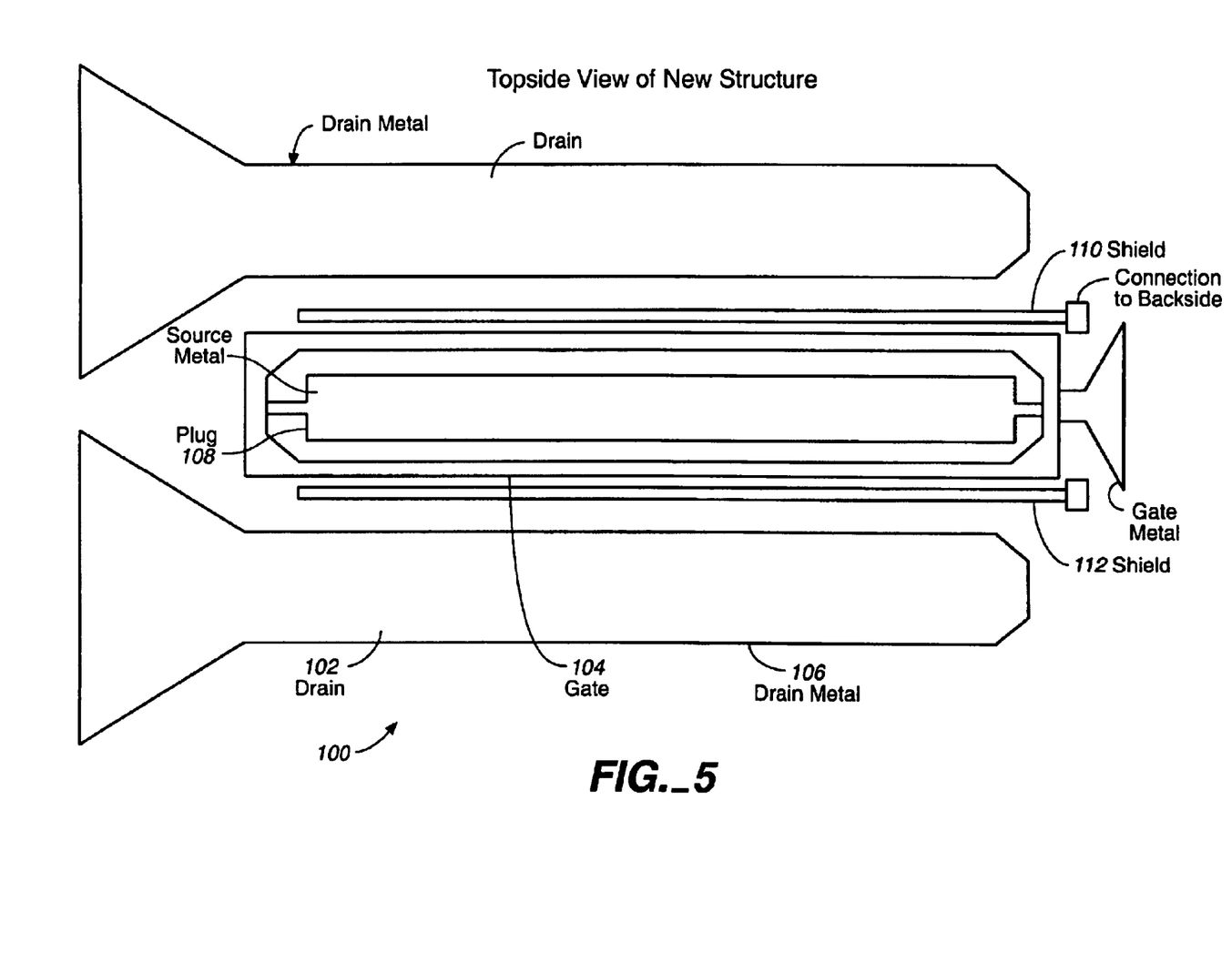
FIG. 5 illustrates a topside view of the microwave transistor structure of FIG. 3 of the present invention.

"FIG. 5 illustrates a topside view of the microwave transistor structure 50 (of FIG. 3) of the present invention. As shown in FIG. 5, the shielding fingers 110 and 112 do not cover the gate finger completely." Therefore, the gate-to-source $C_{gs}$ capacitance is reduced as opposed to the microwave structure 50 that includes the shielding fingers that cover the gate completely, as disclosed in the prior art patent '848 . Indeed, the shielding fingers 110 and 112 do not collect all the parasitic electric field lines, as in the case of '848 patent, and therefore, some of the parasitic electric field lines escape through the gap between the shielding fingers 110 and 112.

The $C_{ds}$ drain-to-source capacitance is also reduced as compared with the prior art structure of '848 patent, because the size of the shielding fingers is smaller than the size of the metal area needed to overlap the gate used in the prior art structure of '848 patent.

A single metal layer solution can be used with a narrower device drain size as compared with the prior art structure of '848 patent. This results in the microwave transistor designs (based on structure 100 of FIG. 5) that can be used for low voltage and high frequency applications. In one embodiment, the microwave transistor structure 100 of FIG. 5 can be used for a low bias drain-to-source voltage (less than 60 Volt).

The microwave structure 100 of FIG. 5 can obtain improvements in both $C_{dg}$ and $C_{ds}$ of better than 20% with minimal max current degradation (less then 5%) as compared to prior art.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A microwave transistor structure comprising:

a substrate having a top surface;

a silicon semiconductor material of a first conductivity type, said silicon semiconductor material having a first dopant concentration and a top surface; said silicon semiconductor material overlaying said top surface of said substrate;

a conductive gate overlying and insulated from said top surface of said silicon semiconductor material;

a first region formed completely within said silicon semiconductor material of said first conductivity type, said first region being of said second conductivity type to form a first enhanced drain drift region of said microwave transistor structure and having a first enhanced drain drift region dopant concentration;

a second region formed in said silicon semiconductor material of said first conductivity type, said second region being of said second conductivity type to form a second enhanced drain drift region of said microwave transistor, said second enhanced drain drift region having a second enhanced drain drift region dopant concentration, said second region contacting said first region, said second enhanced drain drift region dopant concentration being greater than said first enhanced drain drift region dopant concentration;

a drain region formed in said silicon semiconductor material, said drain region being of said second conductivity type; said drain region having a drain dopant concentration greater than said second enhanced drain drift region dopant concentration; said drain region contacting said second enhanced drain drift region;

a body region formed in said silicon semiconductor material, said body region being of said first conductivity type and having a body region dopant concentration, said body region dopant concentration being equal or greater than said first dopant concentration, said body region having a first end underlying said conductive gate, any remaining portion of said silicon semiconductor material underlying said gate being of said first conductivity type;

a source region formed in said silicon semiconductor material, said source region being of said second conductivity type and having a source region dopant concentration, said source region being located within said body region;

a shield plate region formed on said top surface of said silicon semiconductor material over a portion of said first region, said shield plate region being adjacent and parallel to said drain region; said shield plate region being adjacent and parallel to said conductive gate; said shield plate region extending above said top surface of said silicon semiconductor material to a shield plate height level, said shield plate region being insulated from said top surface of said silicon semiconductor material;

a conductive plug region formed in said body region of said silicon semiconductor material, wherein said conductive plug region connects a lateral surface of said body region to said top surface of said substrate; and a contact enhanced region formed in said silicon semiconductor material, said contact enhanced region being of said first conductivity type and having a contact enhanced region dopant concentration, said contact enhanced region dopant concentration being greater than said body region dopant concentration, said contact enhanced region being located within said body region.

2. The microwave transistor structure of claim 1, wherein said conductive plug region further includes:

said conductive plug region formed in said contact enhanced region and said body region of said silicon semiconductor material, wherein said conductive plug region connects a top surface or a lateral surface of said contact enhanced region and connects a lateral surface of said body region to said top surface of said substrate.

3. The microwave transistor structure of claim 1, wherein said substrate further includes:

a silicon substrate.

4. The microwave transistor structure of claim 1, wherein said shield plate region further includes:

said shield plate region being connected to said source region.

5. The microwave transistor structure of claim 1, wherein said shield plate region further includes:

said shield plate region being connected to a backside of said structure.

6. The microwave transistor structure of claim 1, wherein said first conductivity type further comprises:

a P type conductivity type.

7. The microwave transistor structure of claim 1, wherein said conductive plug region further comprises:

a metal plug.

8. The microwave transistor structure of claim 1, wherein said conductive plug region further comprises:

a silicided plug.

9. The microwave transistor structure of claim 8, wherein said silicided plug is selected from the group consisting of a tungsten silicided plug, a titanium silicided plug, a cobalt silicided plug, and a platinum silicided plug.

10. The microwave transistor structure of claim 1, wherein said conductive gate further comprises:

a highly doped poly silicon gate.

11. The microwave transistor structure of claim 1, wherein said conductive gate further comprises:

a sandwich gate further comprising a highly doped polysilicon bottom layer and a top layer selected from the group consisting of a tungsten silicided layer, a titanium silicided layer, a cobalt silicided layer, and a platinum silicided layer.

12. The microwave transistor structure of claim 1, wherein said conductive gate further comprises:

a metal gate.

13. The microwave transistor structure of claim 1, wherein said shield plate region further comprises:

a metal shield plate.

14. The microwave transistor structure of claim 1, wherein said shield plate region further comprises:

a polysilicon shield plate.

15. The microwave transistor structure of claim 1, wherein said shield plate region further comprises:

a polysilicon/silicided shield plate sandwich.

16. The microwave transistor structure of claim 1, wherein said shield plate region further comprises:

a polysilicon/metal shield plate sandwich.

17. The microwave transistor structure of claim 1, wherein said shield plate region further comprises:

a shield plate extending above said top surface of said silicon semiconductor material to said shield plate height level, wherein said shield plate height level is in the range of 4,000 Å–8,000 Å.

18. A microwave transistor structure comprising:

a substrate having a top surface;

a silicon semiconductor material of a first conductivity type, said silicon semiconductor material having a first dopant concentration and a top surface; said silicon semiconductor material overlaying said top surface of said substrate;

a conductive gate overlying and insulated from said top surface of said silicon semiconductor material;

a first enhanced drain drift region formed completely within said semiconductor material to a first depth level, said first enhanced drain drift region being of said second conductivity type, and having a first enhanced drain drift region dopant concentration;

a second enhanced drain drift region formed completely within said semiconductor material to a second depth level, said second enhanced drain drift region being of said second conductivity type, and having a second enhanced drain drift region dopant concentration, said second enhanced drain drift region contacting said first enhanced drain drift region; said second enhanced drain drift region dopant concentration being greater than said first enhanced drain drift region dopant concentration;

a third enhanced drain drift region formed completely within said semiconductor material to a third depth level, said third enhanced drain drift region being of said second conductivity type, and having a third enhanced drain drift region dopant concentration, said third enhanced drain drift region contacting said second enhanced drain drift region; said third enhanced drain drift region dopant concentration being greater than said second enhanced drain drift region dopant concentration;

a drain region formed in said silicon semiconductor material, said drain region being of said second conductivity type; said drain region having a drain dopant concentration greater than said third enhanced drain region dopant concentration; said drain region contacting said third enhanced drain drift region;

a body region formed in said silicon semiconductor material, said body region being of said first conductivity type and having a body region dopant concentration, said body region dopant concentration being equal or greater than said first dopant concentration, said body region having a first end underlying said conductive gate, any remaining portion of said silicon semiconductor material underlying said gate being of said first conductivity type;

a source region formed in said silicon semiconductor material, said source region being of said second conductivity type and having a source region dopant concentration, said source region being located within said body region;

a shield plate region formed on said top surface of said silicon semiconductor material over a portion of said first enhanced drain drift region, said shield plate region being adjacent and parallel to said drain region; said shield plate region being adjacent and parallel to said conductive gate; said shield plate region extending above said top surface of said silicon semiconductor material to a shield plate height level, said shield plate region being insulated from said top surface of said silicon semiconductor material;

a conductive plug region formed in said body region of said silicon semiconductor material, wherein said conductive plug region connects a lateral surface of said body region to said top surface of said substrate; and a contact enhanced region formed in said silicon semiconductor material, said contact enhanced region being of said first conductivity type and having a contact enhanced region dopant concentration, said contact enhanced region dopant concentration being greater than said body region dopant concentration, said contact enhanced region being located within said body region.

19. The microwave transistor structure of claim 18, wherein said conductive plug region further includes:
said conductive plug region formed in said contact enhanced region and said body region of said silicon semiconductor material, wherein said conductive plug region connects a top surface or a lateral surface of said contact enhanced region and connects a lateral surface of said body region to said top surface of said substrate.

20. The microwave transistor structure of claim 18, wherein said substrate further includes:
a silicon substrate.

21. The microwave transistor structure of claim 18, wherein said shield plate region further includes:
said shield plate region being connected to said source region.

22. The microwave transistor structure of claim 18, wherein said shield plate region further includes:
said shield plate region being connected to a backside of said structure.

23. The microwave transistor structure of claim 18, wherein said first conductivity type further comprises:
a P type conductivity type.

24. The microwave transistor structure of claim 18, wherein said conductive plug region further comprises:
a metal plug.

25. The microwave transistor structure of claim 18, wherein said conductive plug region further comprises:
a silicided plug.

26. The microwave transistor structure of claim 25, wherein said silicided plug is selected from the group consisting of a tungsten silicided plug, a titanium silicided plug, a cobalt silicided plug, and a platinum silicided plug.

27. The microwave transistor structure of claim 18, wherein said conductive gate further comprises:
a highly doped polysilicon gate.

28. The microwave transistor structure of claim 18, wherein said conductive gate further comprises:
a sandwich gate further comprising a highly doped polysilicon bottom layer and a top layer selected from the group consisting of a tungsten silicided layer, a titanium silicided layer, a cobalt silicided layer, and a platinum silicided layer.

29. The microwave transistor structure of claim 18, wherein said conductive gate further comprises:
a metal gate.

30. The microwave transistor structure of claim 18, wherein said shield plate region further comprises:
a metal shield plate.

31. The microwave transistor structure of claim 18, wherein said shield plate region further comprises:
a polysilicon shield plate.

32. The microwave transistor structure of claim 18, wherein said shield plate region further comprises:
a polysilicon/silicided shield plate sandwich.

33. The microwave transistor structure of claim 18, wherein said shield plate region further comprises:
a polysilicon/metal shield plate sandwich.

34. The microwave transistor structure of claim 18, wherein said shield plate region further comprises:
a shield plate extending above said top surface of said silicon semiconductor material to said shield plate height level, wherein said shield plate height level is in the range of 4,000 Å–8,000 Å.

35. A microwave transistor structure comprising:
a substrate having a top surface;
a silicon semiconductor material of a first conductivity type, said silicon semiconductor material having a first dopant concentration and a top surface; said silicon semiconductor material overlaying said top surface of said substrate;
a conductive gate overlying and insulated from said top surface of said silicon semiconductor material;
a first enhanced drain drift region formed completely within said semiconductor material to a first depth level, said first enhanced drain drift region being of said second conductivity type, and having a first enhanced drain drift region dopant concentration;
a second enhanced drain drift region formed completely within said semiconductor material to a second depth level, said second enhanced drain drift region being of said second conductivity type, and having a second enhanced drain drift region dopant concentration, said second enhanced drain drift region contacting said first enhanced drain drift region; said second enhanced drain drift region dopant concentration being greater than said first enhanced drain drift region dopant concentration;
a third enhanced drain drift region formed completely within said semiconductor material to a third depth level, said third enhanced drain drift region being of said second conductivity type, and having a third enhanced drain drift region dopant concentration, said third enhanced drain drift region contacting said second enhanced drain drift region; said third enhanced drain drift region dopant concentration being greater than said second enhanced drain drift region dopant concentration;
a fourth enhanced drain drift region formed completely within said semiconductor material to a fourth depth level, said fourth enhanced drain drift region being of said second conductivity type, and having a fourth enhanced drain drift region dopant concentration, said fourth enhanced drain drift region contacting said third enhanced drain drift region; said fourth enhanced drain drift region dopant concentration being greater than said third enhanced drain drift region dopant concentration;
a drain region formed in said silicon semiconductor material, said drain region being of said second conductivity type; said drain region having a drain dopant concentration greater than said fourth enhanced drain drift region dopant concentration; said drain region contacting said fourth enhanced drain drift region;
a body region formed in said silicon semiconductor material, said body region being of said first conductivity type and having a body region dopant concentration, said body region dopant concentration being equal or greater than said first dopant concentration, said body region having a first end underlying said conductive gate, any remaining portion of said silicon semiconductor material underlying said conductive gate being of said first conductivity type;

a source region formed in said silicon semiconductor material, said source region being of said second conductivity type and having a source region dopant concentration, said source region being located within said body region;

a shield plate region formed on said top surface of said silicon semiconductor material over a portion of said first enhanced drain drift region, said shield plate region being adjacent and parallel to said drain region; said shield plate region being adjacent and parallel to said conductive gate; said shield plate region extending above said top surface of said silicon semiconductor material to a shield plate region height level, said shield plate region being insulated from said top surface of said silicon semiconductor material;

a conductive plug region formed in said body region of said silicon semiconductor material, wherein said conductive plug region connects a lateral surface of said body region to said top surface of said substrate; and a contact enhanced region formed in said silicon semiconductor material, said contact enhanced region being of said first conductivity type and having a contact enhanced region dopant concentration, said contact enhanced region dopant concentration being greater than said body region dopant concentration, said contact enhanced region being located within said body region.

36. The microwave transistor structure of claim 35, wherein said conductive plug region further includes:

said conductive plug region formed in said contact enhanced region and said body region of said silicon semiconductor material, wherein said conductive plug region connects a top surface or a lateral surface of said contact enhanced region and connects a lateral surface of said body region to said top surface of said substrate.

37. The microwave transistor structure of claim 35, wherein said substrate further includes:

a silicon substrate.

38. The microwave transistor structure of claim 35, wherein said shield plate region further includes:

said shield plate region being connected to said source region.

39. The microwave transistor structure of claim 35, wherein said shield plate region further includes:

said shield plate region being connected to a backside of said structure.

40. The microwave transistor structure of claim 35, wherein said first conductivity type further comprises:

a P type conductivity type.

41. The microwave transistor structure of claim 35, wherein said conductive plug region further comprises:

a metal plug.

42. The microwave transistor structure of claim 35, wherein said conductive plug region further comprises:

a silicided plug.

43. The microwave transistor structure of claim 42, wherein said silicided plug is selected from the group consisting of a tungsten silicided plug, a titanium silicided plug, a cobalt silicided plug, and a platinum silicided plug.

44. The microwave transistor structure of claim 35, wherein said conductive gate further comprises:

a highly doped polysilicon gate.

45. The microwave transistor structure of claim 35, wherein said conductive gate further comprises:

a sandwich gate further comprising a highly doped polysilicon bottom layer and a top layer selected from the group consisting of a tungsten silicided layer, a titanium silicided layer, a cobalt silicided layer, and a platinum silicided layer.

46. The microwave transistor structure of claim 35, wherein said conductive gate further comprises:

a metal gate.

47. The microwave transistor structure of claim 35, wherein said shield plate region further comprises:

a metal shield plate.

48. The microwave transistor structure of claim 35, wherein said shield plate region further comprises:

a polysilicon shield plate.

49. The microwave transistor structure of claim 35, wherein said shield plate region further comprises:

a polysilicon/silicided shield plate sandwich.

50. The microwave transistor structure of claim 35, wherein said shield plate region further comprises:

a polysilicon/metal shield plate sandwich.

51. The microwave transistor structure of claim 35, wherein said shield plate region further comprises:

a shield plate extending above said top surface of said silicon semiconductor material to said shield plate height level, wherein said shield plate height level is in the range of 4,000 Å–8,000.

* * * * *